United States Patent [19]

Shimura

[11] Patent Number: 5,270,556
[45] Date of Patent: Dec. 14, 1993

[54] SEMICONDUCTOR DEVICE WITH UPPER AND LOWER GATE ELECTRODE STRUCTURE

[75] Inventor: Teruyuki Shimura, Itami, Japan

[73] Assignee: Mitsubishi Denki Kabushiki Kaisha, Tokyo, Japan

[21] Appl. No.: 921,572

[22] Filed: Jul. 30, 1992

[30] Foreign Application Priority Data

Sep. 12, 1991 [JP] Japan .................. 3-263275

[51] Int. Cl.$^5$ .................. H01L 31/072; H01L 31/109; H01L 29/06; H01L 31/075
[52] U.S. Cl. ..................................... 257/192; 257/24; 257/200; 257/656
[58] Field of Search .................. 257/20, 192, 24, 200, 257/656

[56] References Cited

U.S. PATENT DOCUMENTS

| 4,463,366 | 7/1984 | Ishii et al. ............... | 357/22 |
| 4,583,107 | 5/1986 | Clarke ....................... | 357/22 |
| 4,796,068 | 1/1989 | Katayama et al. ........ | 257/20 |
| 5,057,883 | 10/1991 | Noda ........................ | 357/22 |

FOREIGN PATENT DOCUMENTS

| 0061376 | 9/1982 | European Pat. Off. . |
| 0225566 | 6/1987 | European Pat. Off. . |
| 02832276 | 9/1988 | European Pat. Off. . |
| 0389761 | 10/1990 | European Pat. Off. . |
| 239440 | 2/1990 | Japan . |
| 1603260 | 11/1981 | United Kingdom . |
| 2236617 | 4/1991 | United Kingdom . |

OTHER PUBLICATIONS

Onda et al, "Stripped Channel Field Effect Transistors With a Modulation Doped Structure", IEEE International Electron Devices Meeting, Dec. 1989, pp. 5.8.2–5.8.4.

Eugster et al, "Criteria For One-Dimensional Transport In Split-Gate Field Effect Transistors", IEEE International Electron Devices Meeting, Dec. 1989, pp. 13.4.1–13.4.4.

Primary Examiner—Rolf Hille
Assistant Examiner—Wael Fahmy
Attorney, Agent, or Firm—Leydig, Voit & Mayer

[57] ABSTRACT

A semiconductor device includes a layer on a substrate in which a two-dimensional electron gas is produced, source and drain electrodes disposed opposite each other on the substrate, and a gate electrode including a plurality of lower gate electrodes and an upper gate electrode. The lower gate electrodes are spaced at prescribed intervals in a direction perpendicular to a direction connecting the source and drain electrodes and connected to the layer only at their bottom surfaces. The upper gate electrode is disposed on the lower gate electrodes and electrically connects the lower gate electrodes to each other. When a bias voltage is applied to the gate electrode, a depletion layer spreads below the lower gate electrodes and the two-dimensional electron gas is concentrated beneath regions where the lower gate electrodes are absent, producing a quasi one-dimensional electron gas. Therefore, a semiconductor device utilizing the quasi one-dimensional electron gas as a channel current, in which parasitic capacitance is not increased, is achieved.

8 Claims, 5 Drawing Sheets

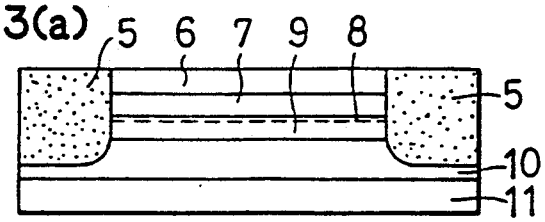
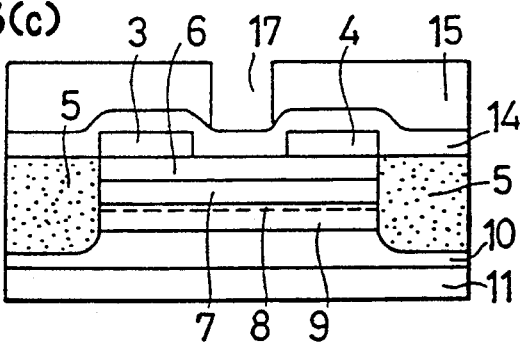
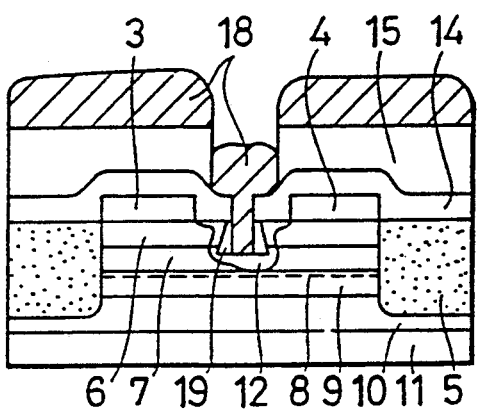
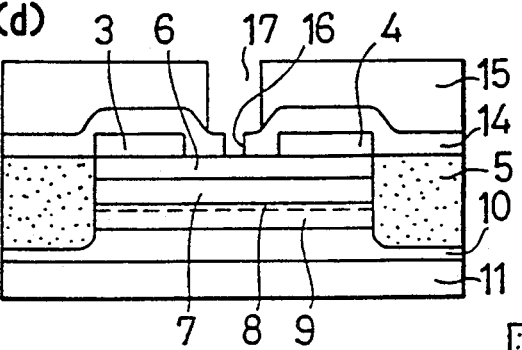
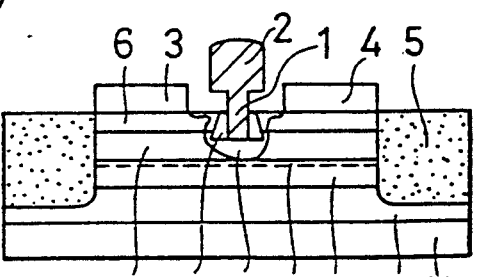
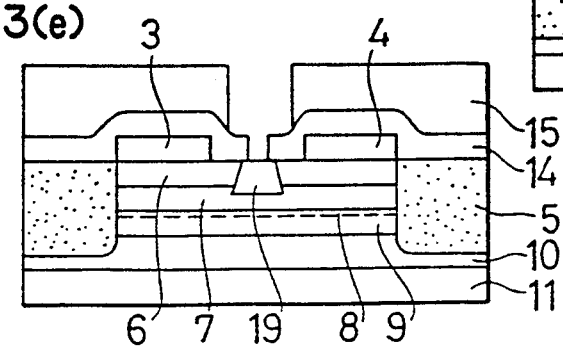

SEMICONDUCTOR DEVICE WITH UPPER AND LOWER GATE ELECTRODE STRUCTURE

FIELD OF THE INVENTION

The present invention relates to a semiconductor device having quasi one-dimensional electron flow and a method for producing such a semiconductor device.

BACKGROUND OF THE INVENTION

Various high-speed semiconductor devices, which utilize a two-dimensional electron gas or a two-dimensional hole gas produced at a heterointerface as a channel layer, have been proposed. At a low temperature, the mobility of electrons in the two-dimensional electron gas is far higher than in a three-dimensional electron gas. When such a two-dimensional electron gas is spatially confined to decrease the degree of freedom of the movement of the electrons, a quasi one-dimensional electron gas is produced, and semiconductor devices utilizing the quasi one-dimensional electron gas as a channel layer have been developed. In the quasi one-dimensional electron gas, electrons move in one direction and scattering of the electrons (especially, phonon scattering) decreases as compared with the two-dimensional electron gas, so that the mobility further increases, resulting in a semiconductor device operating at higher speed.

FIG. 5 is a perspective view partly in a cross section of a prior art high-speed transistor utilizing the quasi one-dimensional electron gas. In FIG. 5, an intrinsic (hereinafter referred to as i type) AlGaAs layer 22 approximately 1000 angstroms thick, an i type GaAs layer 23 approximately 100 angstroms thick, and an n+ type AlGaAs layer 24 approximately 300 angstroms thick having an impurity concentration of $1.5 \times 10^{18}$ cm$^{-3}$ are successively disposed on a semi-insulating GaAs substrate 21. Source and drain electrodes 25 comprising, for example, AuGe/Ni/Au are spaced from each other by a prescribed interval on the n+ type AlGaAs layer 24. Alloy layers 29 beneath the source and drain electrodes 25 reach into the substrate 21 and the source and drain electrodes 25 make ohmic contacts with the semiconductor layers 22 to 24. An interlayer insulating film 26 comprising, for example, hydroxy silicon nitride (SiON) is disposed on the n+ type AlGaAs layer 24 where the source and drain electrodes are absent. An opening 27 penetrates a portion of the insulating layer 26 between the source and drain electrodes 25. A gate electrode 28 comprising aluminum or the like is connected to the substrate 21 and the semiconductor layers 22 to 24 which are exposed in the opening 27.

The i type AlGaAs layer 22, the i type GaAs layer 23, and the n+ type AlGaAs layer 24, which are exposed in the opening 27, i.e., which are connected to the gate electrode 28, are separated in a plurality of stripes running parallel to a direction connecting the source and drain electrodes 25.

FIGS. 6(a) and 6(b) are sectional views taken along a line VI—VI of FIG. 5. In these figures, the same reference numerals as in FIG. 5 designate the same or corresponding parts. The i type AlGaAs layer, the i type GaAs layer, and the n+ type AlGaAs layer are separated by notches 30, resulting in a plurality of fine stripes 40 each comprising i type AlGaAs layer 42, i type GaAs layer 43, and n+ type AlGaAs layer 44. The interval P between the adjacent stripes 40 is about 2000 angstroms. The gate electrode 28 fills up the notches 30 and contacts the side surfaces of each stripe 40.

A description is given of the operation. When no bias voltage is applied to the gate electrode 28, electrons are transferred from the n+ type AlGaAs layer 44 and stored in the i type GaAs layer 43, producing a two-dimensional electron gas 45 as shown in FIG. 6(a). When a negative bias voltage is applied to the gate electrode 28, a depletion layer in the i type GaAs layer 43 expands and the two-dimensional electron gas is concentrated in the center of the i type GaAs layer 43 as shown in FIG. 6(b). That is, the two-dimensional electron gas loses the degree of freedom in a direction perpendicular to an axis of the stripe, resulting in a quasi one-dimensional electron gas 50. In this state, a current flowing between the source and drain electrodes is carried by the one-dimensional electron gas. Concentration of the quasi one-dimensional electron gas 50 is controlled by the bias voltage applied to the gate electrode 28 to control the current flowing between the source and drain electrodes ($I_{DS}$). Since the quasi one-dimensional electron gas serves as a carrier of the current, the mobility of electrons in the quasi electron gas is higher than that in the two-dimensional electron gas, whereby a high-speed FET due to a high mutual conductance (gm) is achieved. In addition, the quasi one-dimensional electron gas has less scattering of electrons than the two-dimensional electron gas, resulting in a low-noise FET.

In the prior art high-speed transistor constituted as described above, since the gate electrode 28 contacts the side surfaces of the stripes 40, gate capacitance increases, limiting the high speed property of the device. In addition, the gate electrode 28 is formed along the stripes 40 each about 2000 angstroms in height. However, precise patterning is difficult on such an uneven surface. Therefore, it is difficult to form a narrow gate electrode.

SUMMARY OF THE INVENTION

It is an object of the present invention to provide a semiconductor device that has a narrow gate electrode, reduced parasitic capacitance, and that utilizes a quasi one-dimensional electron gas.

It is another object of the present invention to provide a method for producing such a semiconductor device.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first aspect of the present invention, a semiconductor device includes a substrate in which a two-dimensional electron gas is produced, source and drain electrodes spaced from each other on the substrate, and a gate electrode including a plurality of lower gate electrodes and an upper gate electrode. The lower gate electrodes are arranged with prescribed spacing in a direction perpendicular to a direction connecting the source and drain electrodes and are connected to the substrate only at their bottom surfaces. The upper gate electrode is disposed on the lower gate electrodes and electrically connects the lower gate electrodes to each other. When a bias voltage is applied to the gate electrode, a depletion layer in the substrate spreads below the lower gate electrodes and the two-dimensional electron gas is concentrated where the lower gate electrodes are absent, producing a quasi one-dimensional electron gas. Therefore, a semiconductor device utilizing the quasi one-dimensional electron gas as a channel, in which parasitic capacitance does not increase, is achieved.

According to a second aspect of the present invention, in a method for producing a semiconductor device, source and drain electrodes spaced from each other by a prescribed interval are formed on a substrate in which a two-dimensional electron gas is formed, a first resist is applied to the entire surface of the wafer and a second resist is applied to the first resist. A stripe-shaped first opening is formed through the second resist between the source and drain electrodes, and a plurality of second openings are formed in the first resist exposed in the first opening. The first opening has a prescribed width and extends in a direction perpendicular to a direction connecting the source and drain electrodes and the second openings are narrower than the first opening and arranged at prescribed spacing in a longitudinal direction of the first opening. Thereafter, a gate metal is deposited on the entire surface of the wafer and unnecessary portions thereof are removed together with the first and second resists by lift-off, resulting in a gate electrode. Therefore, a semiconductor device utilizing a highly-efficient quasi one-dimensional electron gas as a channel, in which parasitic capacitance does not increase, is realized. In addition, a narrow gate is easily formed.

BRIEF DESCRIPTION OF THE DRAWINGS

FIGS. 1(a) and 1(b) are diagrams showing a semiconductor device in accordance with an embodiment of the present invention, in which FIG. 1(a) is a plan view and FIG. 1(b) is a sectional view taken along a line A—A' of FIG. 1(a);

FIGS. 3(a)-3(g) are cross-sectional views illustrating a method for producing the semiconductor device shown in FIGS. 1(a) and 1(b);

DETAILED DESCRIPTION THE PREFERRED EMBODIMENT

Figure 1A:
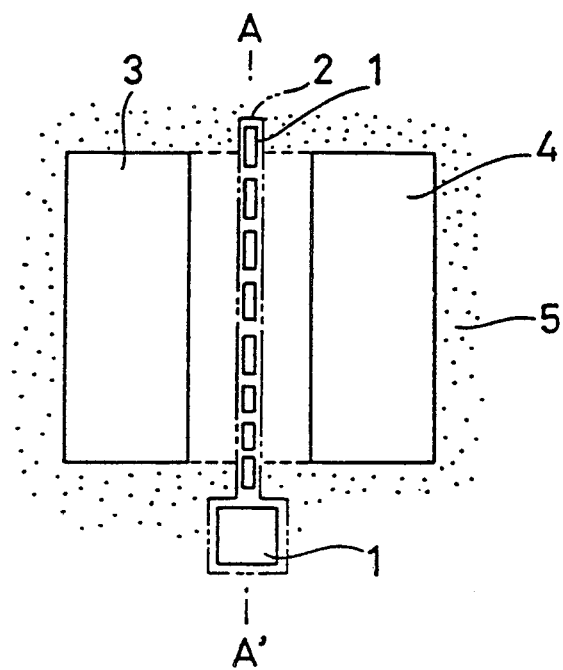
Figure 1B:
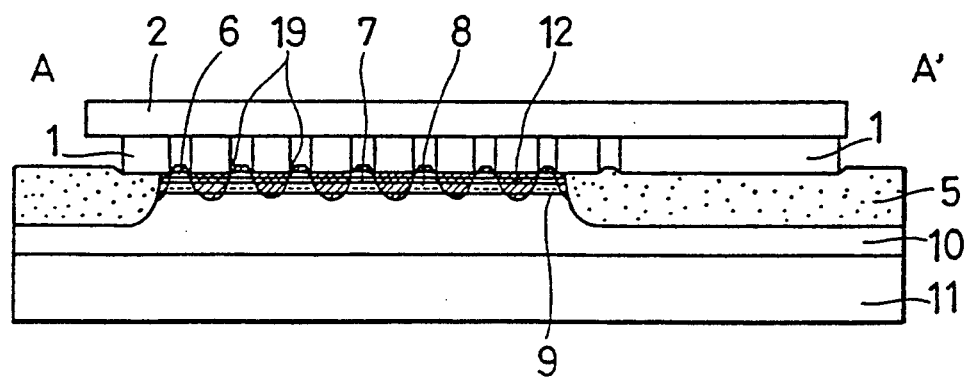

FIGS. 1(a) and 1(b) are diagrams showing a semiconductor device in accordance with an embodiment of the present invention, in which FIG. 1(a) is a plan view and FIG. 1(b) is a sectional view taken along a line A—A' of FIG. 1(a). In the figures, an i type GaAs layer 10 1 micron thick is disposed on a semi-insulating GaAs substrate 11. An i type $In_yGa_{1-y}As$ layer 9 200 angstroms thick is disposed on the i type GaAs layer 10. An $n^+$ type $Al_{0.25}Ga_{0.75}As$ layer 7 having a thickness of 200 angstroms and an impurity concentration of $2 \times 10^{18}$ cm$^{-3}$ is disposed on the i type $In_{0.15}Ga_{0.85}As$ layer 9. An $n^+$ type GaAs layer 6 having a thickness of 400 angstroms and an impurity concentration of $2 \times 10^{18}$ cm$^{-3}$ is disposed on the $n^+$ type $Al_{0.25}Ga_{0.75}As$ layer 7. Source and drain electrodes 3 and 4 comprising, for example, AuGe base alloy are spaced from each other on the $n^+$ type GaAs layer 6 at a prescribed interval. Recesses 19 are formed in the $n^+$ type GaAs layer 6 at prescribed intervals in a direction perpendicular to a direction connecting the source and drain electrodes. Lower gate electrodes 1 comprising Au or Al base alloy are disposed on the bottom surfaces of the recesses 19. An upper gate electrode 2 comprising the same metal as the lower gate electrodes 1 is disposed on the lower gate electrodes 1 and electrically connects the lower gate electrodes 1 to each other. The width of each lower gate electrode 1, i.e., the gate length of this device, is 0.2 micron or less and the interval between adjacent lower gate electrodes 1 is less than 0.5 micron. The width of the upper gate electrode is 1 micron.

A depletion layer 12 spreads in the mesa portions of the $n^+$ type GaAs layer 6 and in the semiconductor layers beneath the lower gate electrodes 1. Electrons are transferred from the $n^+$ type $Al_{0.25}Ga_{0.75}As$ layer 7 and stored in the i type $In_{0.15}Ga_{0.85}As$ layer 9 in the vicinity of a boundary between the layers 7 and 9, producing a two-dimensional electron gas 8.

Figure 2A:
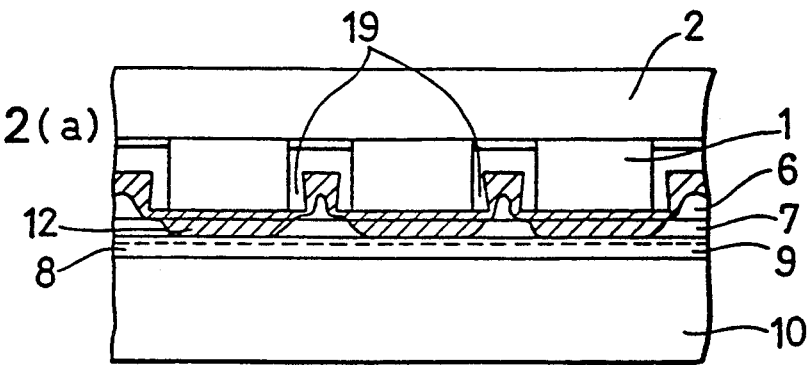
FIGS. 2(a)-2(c) are sectional views for explaining the operation of the semiconductor device shown in FIGS. 1(a) and 1(b)
Figure 2B:
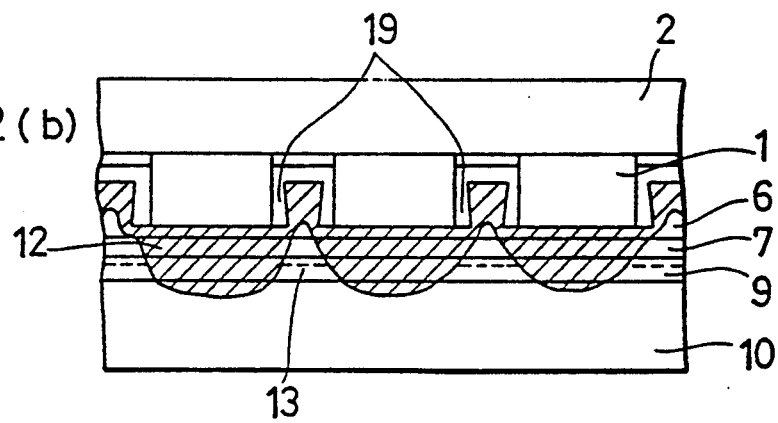
Figure 2C:
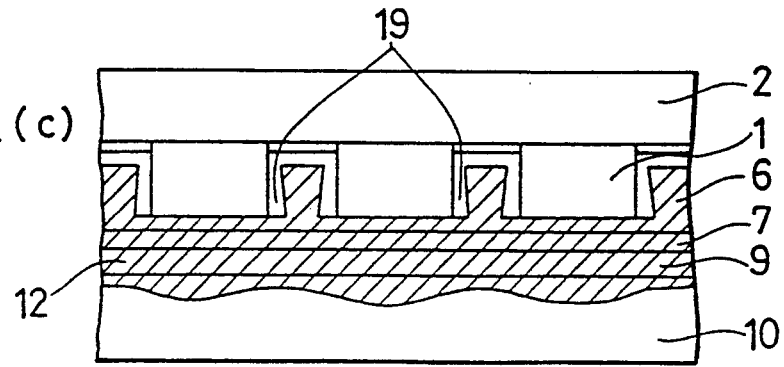

FIGS. 2(a)-2(c) are enlarged views of the channel region of the semiconductor device shown in FIG. 1(b). In these figures, the same reference numerals as those in FIG. 1(b) designate the same or corresponding parts. Reference numeral 13 designates a quasi one-dimensional gas.

A description is given of the operation. In this embodiment, since the depth of each recess 19 is only 300 angstroms, the depletion layer 12 has a planar front when no bias voltage is applied to the gate electrode.

As illustrated in FIG. 2(a), when the gate bias is shallow the, concentration of electrons in the two-dimensional electron gas 8 is controlled by the depletion, layer 12 which changes with the gate bias, thereby controlling the current between the source and drain electrodes ($I_{DS}$). This operating principle is the same as that of a high electron mobility transistor (HEMT).

When the gate bias is increased, the depletion layer 12 beneath the lower gate electrodes 1 expands as shown in FIG. 2(b) and the two-dimensional electron gas 8 concentrates beneath regions where the lower gate electrodes 1 are absent. If the interval between the adjacent lower gate electrodes 1 is sufficiently small, the two-dimensional electron gas 8 becomes a quasi one-dimensional electron gas 13. In this state, scattering of the electrons decreases and the mobility increases, so that mutual conductance (gm) increases in the vicinity of a pinch-off point. That is, high-speed and low-noise properties of the FET are achieved from the low $I_{DS}$ region.

When the gate bias is further increased, the depletion layer 12 spreads over the semiconductor layers 6, 7, and 9 as shown in FIG. 2(c) and the two-dimensional electron gas 8 and the quasi one-dimensional electron gas 13 disappear, resulting in a so-called pinch-off condition. In this state, no current flows between the source and drain electrodes.

In this embodiment, since only the rear surfaces of the lower gate electrodes 1 contact the semiconductor layer, the speed of the device is not reduced by an increase in the gate capacitance, resulting in an highly efficient high-speed transistor.

In addition, since the width of the upper electrode 2 is larger than the width of the lower gate electrode 1, i.e., a so-called T-shaped gate is adopted, the gate resistance is reduced.

In addition, the state shown in FIG. 2(a) is changed to the state shown in FIG. 2(b) by control of the gate bias, whereby the two-dimensional electrons change to the quasi one-dimensional electrons and the mobility of electrons is modulated, causing a change in the mutual conductance (gm), i.e., a so-called mobility modulating transistor is achieved.

In the above-described embodiment, when no bias is applied to the gate electrode, the depth of the depletion layer 12 is shallower than the depth of the two-dimensional gas. The thinner the n+ GaAs layer 6 is or the deeper the recess 19 is, the deeper the depletion layer 12 reaches. Accordingly, by appropriately selecting the thickness of the n+ type GaAs layer 6 and the depth of the recess 19, the characteristics of the device may be varied in many ways.

While in the above-described embodiment the depth of the depletion layer 12 is increased by applying a bias voltage to the gate electrode, it may be increased by increasing the depth of each recess 19 or the thickness of the n+ type GaAs layer 6. Also in this case, the two-dimensional electron gas 8 is concentrated as shown in FIG. 2(b) and thus a quasi one-dimensional electron gas 13 serves as a current carrier. For example, in the structure of FIG. 1(b), when the thickness of the n+ type GaAs layer 6 is 1000 angstroms and the depth of the recess 19 is increased to approximately 1000 angstroms, a high-speed and low-noise semiconductor device using only the quasi one-dimensional electron gas as a carrier and providing a high mutual conductance is achieved. In this structure, if a positive bias is applied to the gate electrode, the depletion layer is reduced and the two-dimensional electron gas is also used as a current carrier.

In the structure of FIG. 1(b), when the thickness of the n+ type GaAs layer 6 is 400 angstroms and the depth of the recess 19 is deeper than 400 angstroms, for example, approximately 500 angstroms, the depletion layer expands deeper and neither the two-dimensional electron gas nor the quasi one-dimensional electron gas are present as illustrated in FIG. 2(c) in a state where no bias is applied to the gate. In this device, a positive bias is applied to the gate to reduce the depletion layer, whereby concentrations of the one-dimensional electron gas and the two-dimensional electron gas are controlled.

A method for producing the semiconductor device of the embodiment of the present invention is illustrated in FIGS. 3(a)-3(g).

Initially, as illustrated in FIG. 3(a), there are successively grown on the semi-insulating GaAs substrate 11 an i type GaAs layer 10, an i type $In_yGa_{1-y}As$ layer 9, an n+ type $Al_xGa_{1-x}As$ layer 7, and an n+ type GaAs layer 6. Preferably, these layers are grown by molecular beam epitaxy (MBE) or metal organic chemical vapor deposition (MOCVD). Then, H+ ions are implanted into the semiconductor layers to form insulating regions 5. B+ ions or O+ ions may be used instead of the H+ ions.

Then, as illustrated in FIG. 3(b), source and drain electrodes 3 and 4 comprising AuGe base alloy or the like are formed on the n+ type GaAs layer 6 by deposition and lift-off method.

Figure 4:
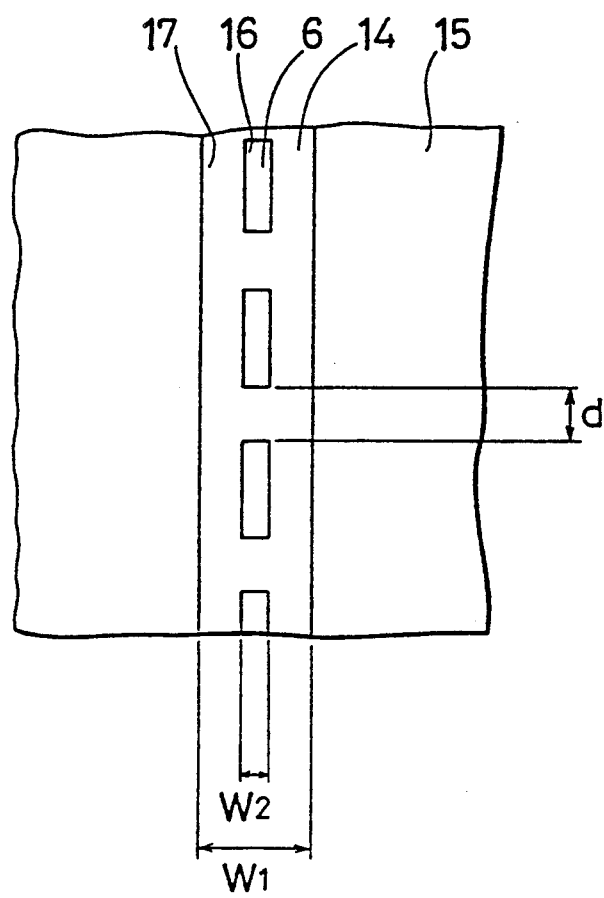
FIG. 4 is a plan view of a wafer after a resist patterning in the method for producing the semiconductor device shown in FIGS. 3(a)-3(g)
Figure 5:
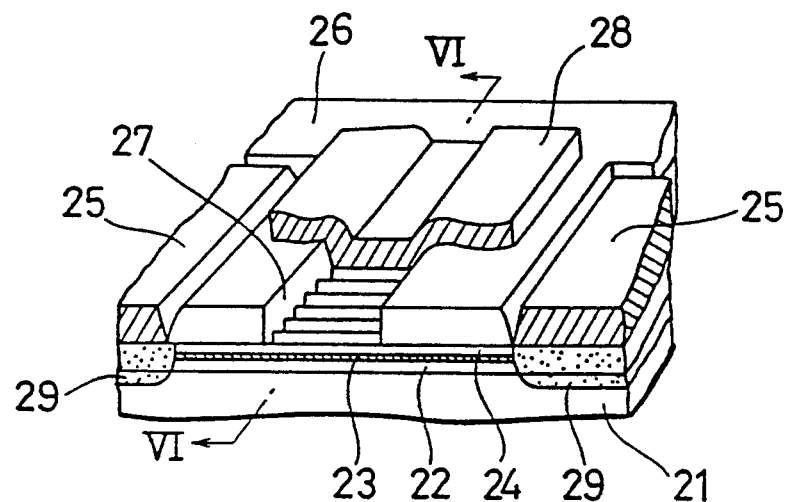
FIG. 5 is a perspective view including a cross section, showing a prior art semiconductor device utilizing a quasi one-dimensional electron gas.
Figure 6:
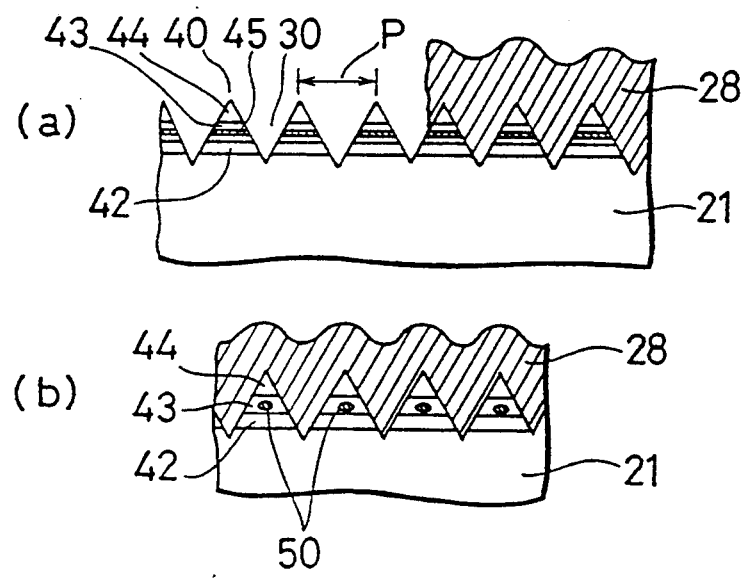
FIGS. 6(a) and 6(b) are sectional views taken along a line VI—VI of FIG. 5 for explaining the operation of the semiconductor device of FIG. 5.

Then, an electron-beam resist 14 and a stepper resist 15 are successively deposited on the wafer. Using a stepper, i.e., a reduction-type projection printing apparatus, an opening 17 is formed through the resist 15 as illustrated in FIG. 3(c). Then, using an electron-beam exposure apparatus, a plurality of openings 16 are formed through the resist 14 as illustrated in FIG. 3(d) and FIG. 4. The gate length of the semiconductor device is determined by the width of the opening 16. FIG. 4 is a plan view showing the electron-beam resist 14 and the stepper resist 15 after the formation of the opening 16. In FIG. 4, the width $w_1$ of the opening 17 is 1 micron and the width $w_2$ of each opening 16 is 0.2 micron or less. Since the beam of the electron-beam exposure apparatus can be narrowed down to about 0.06 micron, it is easy to make the width $w_2$ 0.2 micron or less. In addition, a space d between the adjacent openings 16 is below 0.5 micron. The dimension of a pad at the end of the gate electrode shown in FIG. 1(a) is about 3 $\mu m \times 3$ $\mu m$.

Then, as illustrated in FIG. 3(e), a recess 19 is formed by etching using the resists 14 and 15 as a mask. Thereafter, as illustrated in FIG. 3(f), an Au or Al base metal 18 is deposited on the entire surface of the wafer.

Finally, the gate metal 18 on the resist 15 is removed by lift-off, resulting in a T-shaped gate electrode comprising a lower gate electrode 1 and an upper gate electrode 2 shown in FIG. 3(g).

In the production method according to the present invention, two resist layers are deposited on the substrate between the source and drain electrodes. Then, a stripe-shaped first opening is formed in the upper resist and a plurality of second openings are formed in the lower resist. The second openings are arranged in a longitudinal direction of the first opening at prescribed intervals. Then, a gate metal is deposited on the entire surface of the wafer and unnecessary portions thereof are removed by lift-off. Therefore, a semiconductor device utilizing a highly-efficient quasi one-dimensional electron gas in a channel, in which the parasitic capacitance does not increase, is easily fabricated. In addition, since the first and second resists are patterned on a flat substrate, a precise gate is easily achieved.

In the production method illustrated in FIGS. 3(a)-3(g), the recess 19 penetrates through the n+ type GaAs layer 6 and reaches the n+ type $Al_xGa_{1-x}As$ layer 7. However, if the etching time is shortened, the bottom of the recess 19 remains in the n+ type GaAs layer 6 as shown in FIGS. 1 and 2.

In the above-illustrated production method, the upper resist is patterned in a stepper exposure and the lower resist is patterned by electron-beam exposure, but both of them may be patterned by electron-beam exposure. In addition, the kinds of resists, the intensity of the exposures and the like are appropriately chosen so that the lower resist is not exposed when the upper resist is exposed.

As is evident from the foregoing description, according to the present invention, a semiconductor device includes a gate electrode comprising a plurality of lower gate electrodes and an upper gate electrode on a substrate between source and drain electrodes. The lower gate electrodes are spaced at prescribed intervals in a direction perpendicular to a direction connecting the source and drain electrodes are connected to the substrate only at their surfaces. The upper gate electrode is disposed on the lower gate electrodes and electrically connects the lower gate electrodes to each other. When a bias voltage is applied to the gate electrode, a depletion layer in the substrate spreads below the lower gate electrodes and the two-dimensional electron gas is concentrated beneath, regions where the lower gate electrodes are absent, producing a quasi one-dimensional electron gas. Therefore, a semiconductor device utilizing the quasi one-dimensional electron gas as a channel, in which parasitic capacitance does not increase, is achieved.

In a method for producing the semiconductor device, two resist layers are deposited on the substrate between the source and drain electrodes, a stripe-shaped first opening is formed through the upper resist and a plurality of second openings are formed through the lower resist exposed in the first opening. The first opening has a prescribed width and extends in a direction perpendicular to a direction connecting the source and drain electrodes, and the second openings are narrower than the first opening and arranged at prescribed intervals in a longitudinal direction of the first opening. Thereafter, a gate metal is deposited on the entire surface of the wafer and unnecessary portions thereof are removed together with the first and second resists by lift-off, resulting in a gate electrode. Therefore, a semiconductor device utilizing a highly-efficient quasi one-dimensional electron gas, in which parasitic capacitance does not increase, is realized. In addition, since the patterning of the resist is carried out on a flat substrate, a precise gate is easily formed.

What is claimed is:

1. A semiconductor device comprising:
    a semiconductor structure including a high resistivity substrate, an intrinsic semiconductor layer disposed on the substrate, a first n-type semiconductor layer disposed on and forming a two-dimensional electron gas in the intrinsic layer, and a second n-type semiconductor layer disposed on the first n-type semiconductor layer, the second n-type semiconductor layer including a plurality of recesses extending toward but not reaching the first n-type semiconductor layer;
    source and drain electrodes spaced from each other and disposed on the second n-type semiconductor layer; and
    a gate electrode including a plurality of lower gate electrodes having bottom surfaces, spaced at prescribed intervals along a direction perpendicular to a direction connecting the source and drain electrodes and disposed in respective recesses contacting the second n-type semiconductor layer, and an upper gate electrode disposed on, contacting, and electrically connecting the lower gate electrodes to each other.

2. The semiconductor device of claim 1 wherein the upper gate electrode and lower gate electrodes have respective widths and the width of the upper gate electrode is larger than the widths of the lower gate electrodes.

3. The semiconductor device of claim 1 wherein a depletion layer in the semiconductor structure is present in the first and second n-type semiconductor layers but does not extend into the intrinsic semiconductor layer in which the two-dimensional electron gas is formed when no voltage bias is applied to the gate electrode.

4. The semiconductor device of claim 1 wherein a depletion layer in the semiconductor structure is present in the first and second n-type semiconductor layers and extends into the intrinsic layer in which the two-dimensional electron gas is formed when no voltage bias is applied to the gate electrode.

5. The semiconductor device of claim 1 wherein a depletion layer in the semiconductor structure is present in the first and second n-type semiconductor layers and extends through the intrinsic layer in which the two-dimensional electron gas is formed when no voltage bias is applied to the gate electrode.

6. The semiconductor device of claim 1 wherein the semiconductor structure includes semi-insulating GaAs as the high resistivity substrate, an intrinsic GaAs layer disposed on the substrate, intrinsic InGaAs as the layer in which a two-dimensional electron gas is formed, AlGaAs a the first n-type semiconductor layer forming the two-dimensional electron gas, and GaAs as the second n-type semiconductor layer.

7. The semiconductor device of claim 1 wherein the upper gate electrode is spaced from the second n-type semiconductor layer.

8. The semiconductor device of claim 6 in which the first n-type semiconductor layer is about 400 Angstroms thick and the recesses extend into the first n-type semiconductor layer to a depth of about 300 Angstroms.

* * * * *